(12) United States Patent
L'Heureux et al.

(10) Patent No.: US 10,861,681 B2
(45) Date of Patent: Dec. 8, 2020

(54) APPARATUS FOR COLLECTION AND SUBSEQUENT REACTION OF LIQUID AND SOLID EFFLUENT INTO GASEOUS EFFLUENT

(71) Applicant: Applied Materials, Inc., Santa Clara, CA (US)

(72) Inventors: James L'Heureux, Santa Clara, CA (US); Ryan T. Downey, San Jose, CA (US); David Muquing Hou, Cupertino, CA (US); Yan Rozenzon, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 133 days.

(21) Appl. No.: 15/961,482

(22) Filed: Apr. 24, 2018

(65) Prior Publication Data
US 2018/0337027 A1 Nov. 22, 2018

Related U.S. Application Data

(60) Provisional application No. 62/508,930, filed on May 19, 2017.

(51) Int. Cl.
*H01J 37/32* (2006.01)
*B01D 53/32* (2006.01)
*H01L 21/67* (2006.01)

(52) U.S. Cl.
CPC ........ *H01J 37/32844* (2013.01); *B01D 53/32* (2013.01); *H01J 37/32862* (2013.01);
(Continued)

(58) Field of Classification Search
CPC .......... H01J 37/32844; H01J 37/32889; H01J 37/32862; H01J 2237/002;
(Continued)

(56) References Cited

U.S. PATENT DOCUMENTS 2,290,323 A 7/1942 Graham
2,514,894 A 7/1950 Naab
(Continued)

FOREIGN PATENT DOCUMENTS

CN 203779727 U 8/2014
CN 104973603 A 10/2015
(Continued)

OTHER PUBLICATIONS

Taiwanese Office Action (with attached English translation) for Application No. 106112166; dated Dec. 24, 2018; 9 total pages.
(Continued)

*Primary Examiner* — Rudy Zervigon
(74) *Attorney, Agent, or Firm* — Patterson + Sheridan, LLP

(57) ABSTRACT

Embodiments disclosed herein include an abatement system for abating compounds produced in semiconductor processes. The abatement system includes an exhaust cooling apparatus located downstream of a plasma source. The exhaust cooling apparatus includes a plate and a cooling plate disposed downstream of the plate. During operation, materials collected on the plate react with cleaning radicals to form a gas. The temperature of the plate is higher than the temperature of the cooling plate in order to improve the reaction rate of the reaction of the cleaning radicals and the materials on the plate.

22 Claims, 7 Drawing Sheets

(52) U.S. Cl.
CPC .. *H01J 37/32889* (2013.01); *H01L 21/67017* (2013.01); *H01L 21/67109* (2013.01); *B01D 2257/204* (2013.01); *B01D 2257/55* (2013.01); *B01D 2258/0216* (2013.01); *B01D 2259/818* (2013.01); *H01J 2237/002* (2013.01)

(58) Field of Classification Search
CPC ........ H01L 21/67109; H01L 21/67017; B01D 53/32; B01D 2257/55; B01D 2258/0216; B01D 2257/204; B01D 2259/818; Y02C 20/30
USPC ........................................ 118/715; 156/345.1
See application file for complete search history.

(56) References Cited

U.S. PATENT DOCUMENTS

| | | | |
|---|---|---|---|
| 3,081,068 A | 3/1963 | Milleron | |
| 3,719,052 A * | 3/1973 | White | F25B 21/02 62/3.2 |
| 3,892,550 A | 7/1975 | Riis | |
| 5,141,714 A | 8/1992 | Obuchi et al. | |
| 5,211,729 A | 5/1993 | Sherman | |
| 5,422,081 A | 6/1995 | Miyagi et al. | |
| 5,427,610 A | 6/1995 | Croker | |
| 5,453,125 A | 9/1995 | Krogh | |
| 5,746,790 A | 5/1998 | Niimura et al. | |
| 5,819,683 A | 10/1998 | Ikeda et al. | |
| 5,904,757 A | 5/1999 | Hayashi et al. | |
| 5,928,426 A | 7/1999 | Aitchison | |
| 6,015,463 A | 1/2000 | Cox | |
| 6,156,107 A | 12/2000 | Hayashi et al. | |
| 6,238,514 B1 | 5/2001 | Gu | |
| 6,241,793 B1 | 6/2001 | Lee et al. | |
| 6,488,745 B2 | 12/2002 | Gu | |
| 6,517,913 B1 * | 2/2003 | Cheung | B01D 45/06 427/585 |
| 6,528,420 B1 | 3/2003 | Tong et al. | |
| 6,689,252 B1 * | 2/2004 | Shamouilian | B01D 53/68 204/157.15 |
| 6,908,499 B2 * | 6/2005 | Lin | C23C 16/4412 55/392.1 |
| 6,966,936 B2 * | 11/2005 | Yamasaki | C23C 16/4412 55/385.2 |
| 7,044,997 B2 | 5/2006 | Mardian et al. | |
| 7,387,685 B2 | 6/2008 | Carpenter et al. | |
| 7,727,296 B2 | 6/2010 | Tojo et al. | |
| 7,867,312 B2 | 1/2011 | Engerran | |
| 8,057,564 B2 | 11/2011 | Tsuji | |
| 8,246,705 B2 | 8/2012 | Bain et al. | |
| 8,915,775 B2 | 12/2014 | Ikeda et al. | |
| 9,057,388 B2 | 6/2015 | Comeau et al. | |
| 9,240,308 B2 | 1/2016 | Cox et al. | |
| 9,669,139 B2 | 6/2017 | Coulthard et al. | |
| 9,896,761 B2 | 2/2018 | Hara et al. | |
| 10,036,090 B2 | 7/2018 | Komori et al. | |
| 2001/0003892 A1 | 6/2001 | Rikyuu et al. | |
| 2002/0159924 A1 | 10/2002 | Arno et al. | |
| 2007/0175188 A1 | 8/2007 | Tsuji | |
| 2009/0217634 A1 | 9/2009 | Choi | |
| 2010/0275900 A1 | 11/2010 | Bain et al. | |
| 2012/0258516 A1 | 10/2012 | Schultz et al. | |
| 2013/0284724 A1 | 10/2013 | Cox et al. | |
| 2013/0340681 A1 | 12/2013 | Wagner et al. | |
| 2014/0261702 A1 * | 9/2014 | Meng | C23C 16/345 137/1 |
| 2014/0262033 A1 | 9/2014 | Herbert et al. | |
| 2015/0000870 A1 | 1/2015 | Hosotani et al. | |
| 2015/0187562 A1 | 7/2015 | Lee et al. | |
| 2015/0247658 A1 | 9/2015 | Cosby, II et al. | |
| 2015/0252473 A1 | 9/2015 | Dickinson | |
| 2015/0255256 A1 | 9/2015 | Cox et al. | |
| 2015/0357168 A1 | 12/2015 | Dickinson | |
| 2016/0107117 A1 | 4/2016 | Raj et al. | |
| 2016/0133442 A1 | 5/2016 | Cox et al. | |
| 2018/0166306 A1 | 6/2018 | Hou et al. | |
| 2018/0337027 A1 | 11/2018 | L'Heureux et al. | |

FOREIGN PATENT DOCUMENTS

| | | |
|---|---|---|
| JP | 54154814 A * | 12/1979 |
| JP | 2004063866 A | 2/2004 |
| TW | 201536114 A | 9/2015 |
| TW | 201604320 A | 2/2016 |

OTHER PUBLICATIONS

PCT International Search Report and Written Opinion dated Jul. 31, 2018, for International Application No. PCT/US2018/029031.

* cited by examiner

APPARATUS FOR COLLECTION AND SUBSEQUENT REACTION OF LIQUID AND SOLID EFFLUENT INTO GASEOUS EFFLUENT

CROSS-REFERENCE TO RELATED APPLICATIONS

This application claims priority to U.S. Provisional Patent Application Ser. No. 62/508,930, filed on May 19, 2017, which herein is incorporated by reference.

BACKGROUND

Field

Embodiments of the present disclosure generally relate to semiconductor processing equipment. More particularly, embodiments of the present disclosure relate to an abatement system and a vacuum processing system for abating compounds produced in semiconductor processes.

Description of the Related Art

The process gases used by semiconductor processing facilities include many compounds, such as perfluorocarbons (PFCs), which must be abated or treated before disposal, due to regulatory requirements and environmental and safety concerns. Typically, a remote plasma source may be coupled to a processing chamber to abate the compounds coming out of the processing chamber. A reagent may be injected into the plasma source to assist the abatement of the compounds.

Conventional abatement technology for abating PFCs utilizes water vapor as a reagent, which provides good destruction removal efficiency (DRE). However, abatement of certain compounds using water vapor in the remote plasma source can result in the formation of solid particles in the remote plasma source and equipment downstream of the remote plasma source, such as exhaust line and pumps. In addition, the exhaust exiting the remote plasma source may be at an elevated temperature, which can cause issues at the pump downstream of the remote plasma source.

Accordingly, what is needed in the art is an improved abatement system for abating compounds produced in semiconductor processes.

SUMMARY

Embodiments of the present disclosure relate to an abatement system and a vacuum processing system for abating compounds produced in processes. In one embodiment, an exhaust cooling apparatus includes a body assembly having a first end, a second end, an inlet port and an outlet port, the body assembly having a hollow interior fluidly connecting the inlet port and the outlet port, a first plate disposed in the hollow interior, and a second plate disposed in the hollow interior between the first plate and the outlet port, the second plate having temperature control elements operable to maintain the second plate cooler than the first plate.

In another embodiment, an abatement system includes a first plasma source, an exhaust cooling apparatus coupled to the first plasma source, and a second plasma source coupled to the exhaust cooling apparatus.

In another embodiment, an exhaust cooling apparatus includes a body assembly having a first end, a second end, an inlet port and an outlet port, the body assembly having a hollow interior fluidly connecting the inlet port and the outlet port, a tray disposed in the hollow interior, and a plate disposed in the hollow interior between the tray and the outlet port.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
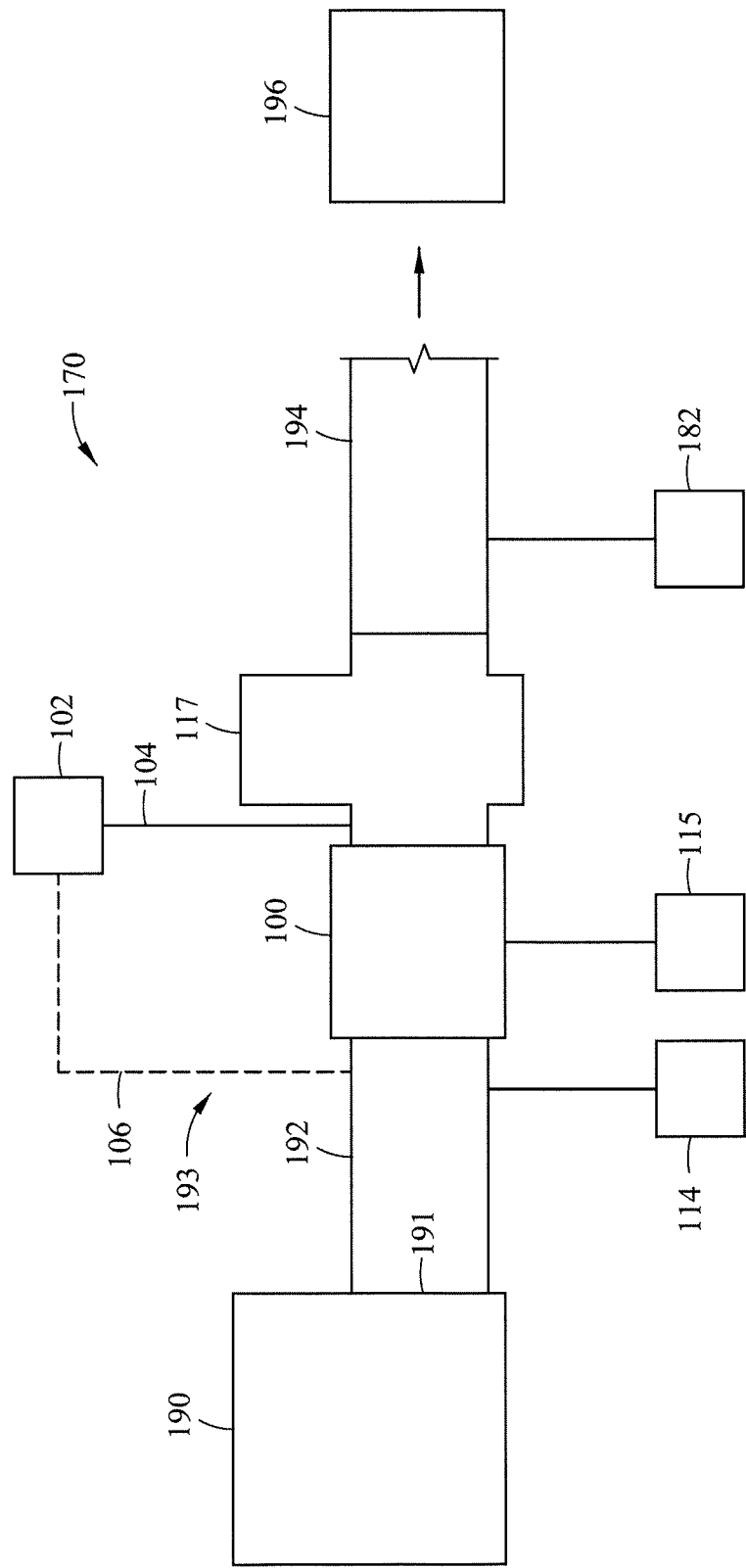
FIG. 1 is a schematic side view of a vacuum processing system including an exhaust cooling apparatus according to one embodiment described herein.

FIG. 1 is a schematic side view of a vacuum processing system 170 having an exhaust cooling apparatus 117 utilized in an abatement system 193. The vacuum processing system 170 includes at least a vacuum processing chamber 190, a plasma source 100, and the exhaust cooling apparatus 117. The abatement system 193 includes at least the plasma source 100 and the exhaust cooling apparatus 117. The vacuum processing chamber 190 is generally configured to perform at least one integrated circuit manufacturing process, such as a deposition process, an etch process, a plasma treatment process, a preclean process, an ion implant process, or other integrated circuit manufacturing process. In some embodiments, the vacuum processing chamber 190 is configured to process a substrate for display or solar applications. The process performed in the vacuum processing chamber 190 may be plasma assisted. For example, the process performed in the vacuum processing chamber 190 may be a plasma deposition process for depositing a silicon-based material or a plasma etch process for removing a silicon-based material.

The vacuum processing chamber 190 has a chamber exhaust port 191 coupled to the plasma source 100 of the abatement system 193 via a foreline 192. The exhaust cooling apparatus 117 is coupled to the plasma source 100 in order to cool the exhaust exiting the plasma source 100 and to collect particles formed in the plasma source 100. The exhaust cooling apparatus 117 is coupled to an exhaust conduit 194 to pumps and facility exhaust, schematically indicated by a single reference numeral 196 in FIG. 1. The pumps are generally utilized to evacuate the vacuum processing chamber 190, while the facility exhaust generally includes scrubbers or other exhaust cleaning apparatus for preparing the effluent of the vacuum processing chamber 190 to enter the atmosphere.

The plasma source 100 is utilized to perform an abatement process on gases and/or other materials exiting the vacuum processing chamber 190 so that such gases and/or other materials may be converted into a more environmentally and/or process equipment friendly composition. In some embodiments, an abatement reagent source 114 is coupled to the foreline 192 and/or the plasma source 100. The abatement reagent source 114 provides an abatement reagent into the plasma source 100 which may be energized to react with or otherwise assist converting the materials exiting the vacuum processing chamber 190 into a more environmentally and/or process equipment friendly composition. Optionally, a purge gas source 115 may be coupled to the plasma source 100 for reducing deposition on components inside the plasma source 100.

The exhaust cooling apparatus 117 is coupled between the plasma source 100 and the exhaust conduit 194 for reducing the temperature of the exhaust exiting the plasma source 100 and for collecting particles formed in the plasma source 100. In one example, the exhaust cooling apparatus 117 is a part of the abatement system 193. The exhaust exiting the plasma source 100 may deposit on cold surfaces (surfaces having a temperature substantially lower than the temperature of the exhaust) inside of the exhaust cooling apparatus 117. An example of the material deposited in the exhaust cooling apparatus is silicon dioxide. In some embodiments, the vacuum processing chamber 190 includes a remote plasma source for generating cleaning radicals, such as fluorine radicals, that are flowed into the vacuum processing chamber 190 to clean the vacuum processing chamber 190. Unreacted cleaning radicals may exit the vacuum processing chamber 190 and enter the plasma source 100 and the exhaust cooling apparatus 117 to remove materials deposited in the plasma source 100 and the exhaust cooling apparatus 117. In some embodiments, the cleaning process of the vacuum processing chamber 190 is performed efficiently, so a minimum amount of unreacted cleaning radicals may exit the vacuum processing chamber 190. The minimum amount of cleaning radicals is not enough to clean the plasma source 100 and the exhaust cooling apparatus 117.

A second plasma source 102 may be utilized to generate cleaning radicals to clean the plasma source 100 and/or the exhaust cooling apparatus 117. The second plasma source 102 may be coupled to the exhaust cooling apparatus 117 via a conduit 104, as shown in FIG. 1. Cleaning radicals generated in the second plasma source 102 may flow into the exhaust cooling apparatus 117 to remove materials formed or collected in the exhaust cooling apparatus 117. Alternatively, the second plasma source 102 may be coupled to the foreline 192 via a conduit 106 to provide cleaning radicals to the plasma source 100. In one embodiment, the second plasma source 102 is coupled to the plasma source 100 via a conduit (not shown). The second plasma source 102 may be part of the abatement system 193.

Optionally, a pressure regulating module 182 may be coupled to at least one of the plasma source 100 or the exhaust conduit 194. The pressure regulating module 182 injects a pressure regulating gas, such as Ar, N, or other suitable gas which allows the pressure within the plasma source 100 to be better controlled, and thereby provide more efficient abatement performance. In one example, the pressure regulating module 182 is a part of the abatement system 193.

Figure 2A:
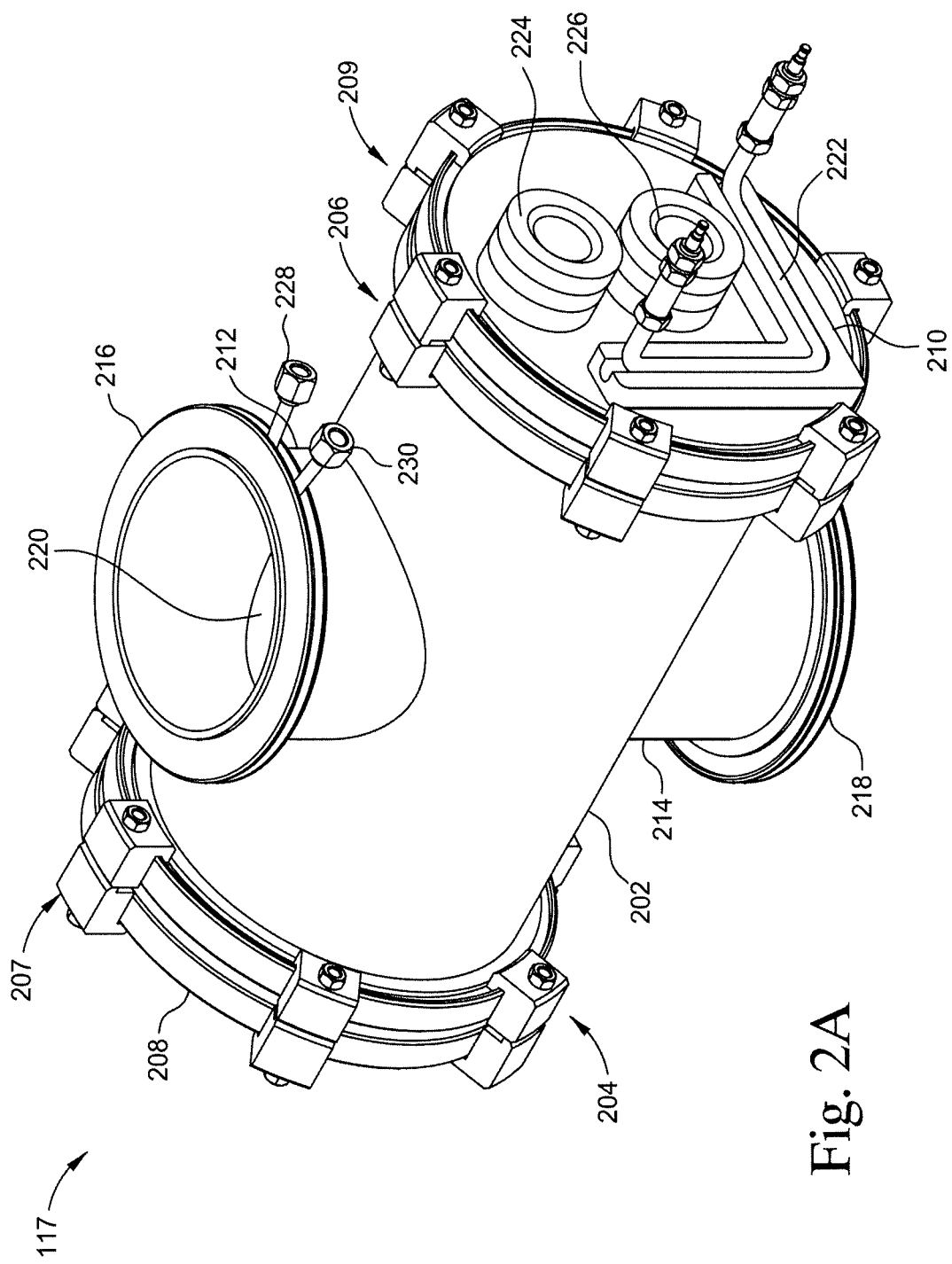
FIG. 2A is a schematic perspective view of the exhaust cooling apparatus according to one embodiment described herein.

FIG. 2A is a schematic perspective view of the exhaust cooling apparatus 117 according to one embodiment described herein. As shown in FIG. 2A, the exhaust cooling apparatus 117 includes a body assembly 202 having a first end 204, a second end 206 opposite the first end 204, an inlet port 212, and an outlet port 214 opposite the inlet port 212. The body assembly 202 has a hollow interior fluidly connecting the inlet port 212 and the outlet port 214. The body assembly 202 may be cylindrical, as shown in FIG. 2A, or other suitable shape. A first end plate 208 is coupled to the first end 204 by a plurality of fastening devices 207, such as a plurality of clamps, bolts or by other suitable techniques. In one embodiment, the first end plate 208 is an integral part of the body assembly 202. A second end plate 210 is coupled to the second end 206 by a plurality of fastening devices 209, such as a plurality of clamps, bolts, or by other suitable techniques. In one embodiment, the second end plate 210 is an integral part of the body assembly 202. One or more viewing ports 224, 226 are formed in the first and/or second end plates 208, 210.

A plate 220 is disposed in the body assembly 202 of the exhaust cooling apparatus 117. The plate 220 may be planar or curved. During operation, the plate 220 collects materials, such as silicon dioxide, exiting the plasma source 100 (as shown in FIG. 1). Cleaning radicals, such as fluorine radicals, are introduced into the exhaust cooling apparatus 117 and react with the materials collected on the plate 220 or otherwise present in the exhaust cooling apparatus 117 to form a gas, such as silicon tetrafluoride. The cleaning radicals may be generated in the second plasma source 102 (as shown in FIG. 1) or in the remote plasma source that is coupled to the vacuum processing chamber 190 (as shown in FIG. 1).

The reaction of the cleaning radicals and the materials collected on the plate 220 may have an increased reaction rate at an elevated temperature, such as the temperature of the exhaust entering the exhaust cooling apparatus 117. Thus, the plate 220 is not cooled. For example, the plate 220 does not include a cooling channel formed therein for a coolant to flow therethrough. In the embodiment depicted in FIG. 2A, the temperature of the plate 220 is not controlled by a temperature controlling device. The plate 220 substantially takes the temperature of the exhaust entering the exhaust cooling apparatus 117. Alternatively, the plate 220 may be actively heated, for example by resistive heaters. The plate 220 is fabricated from a material having low thermal conductivity. The plate 220 may be fabricated from stainless steel, such as 316L stainless steel.

The reaction of the cleaning radicals and the materials collected on the plate 220 may be exothermic, further contributing to maintaining an elevated temperature of the plate 220. In one embodiment, the temperature of the plate 220 ranges from about 400 degrees Celsius to about 500 degrees Celsius.

A cooling device 222 may be coupled to the second plate 210 to prevent the seal disposed between the second plate 210 and the second end 206 of the body assembly 202 from degrading due to the elevated temperature of the second plate 210. The cooling device 222 may be a tube or passage connected to a coolant source, and a coolant is flowed through the tube to lower the temperature of the second plate 210. A thermal insulator (not shown) may be disposed between the second plate 210 and the plate 220 to prevent cooling of the plate 220 by the cooled second plate 210. A cooling device (not shown) may be coupled to the first plate 208 to prevent the seal disposed between the first plate 208 and the first end 204 from degrading due to the elevated temperature of the first plate 208. Similarly, cooling devices 216, 218 may be coupled to the inlet port 212 and the outlet port 214, respectively, to protect seals in that region of the exhaust cooling apparatus 117. In one example, the cooling device 216 may be a tube including a coolant inlet 228 and a coolant outlet 230. The cooling device 218 may be the same as the cooling device 216. Cooling devices 216, 218 may conform to the shape of the openings of the inlet port 212 and the outlet port 214. In one embodiment, the cooling devices 216, 218 are circular, as shown in FIG. 2A.

Figure 2B:
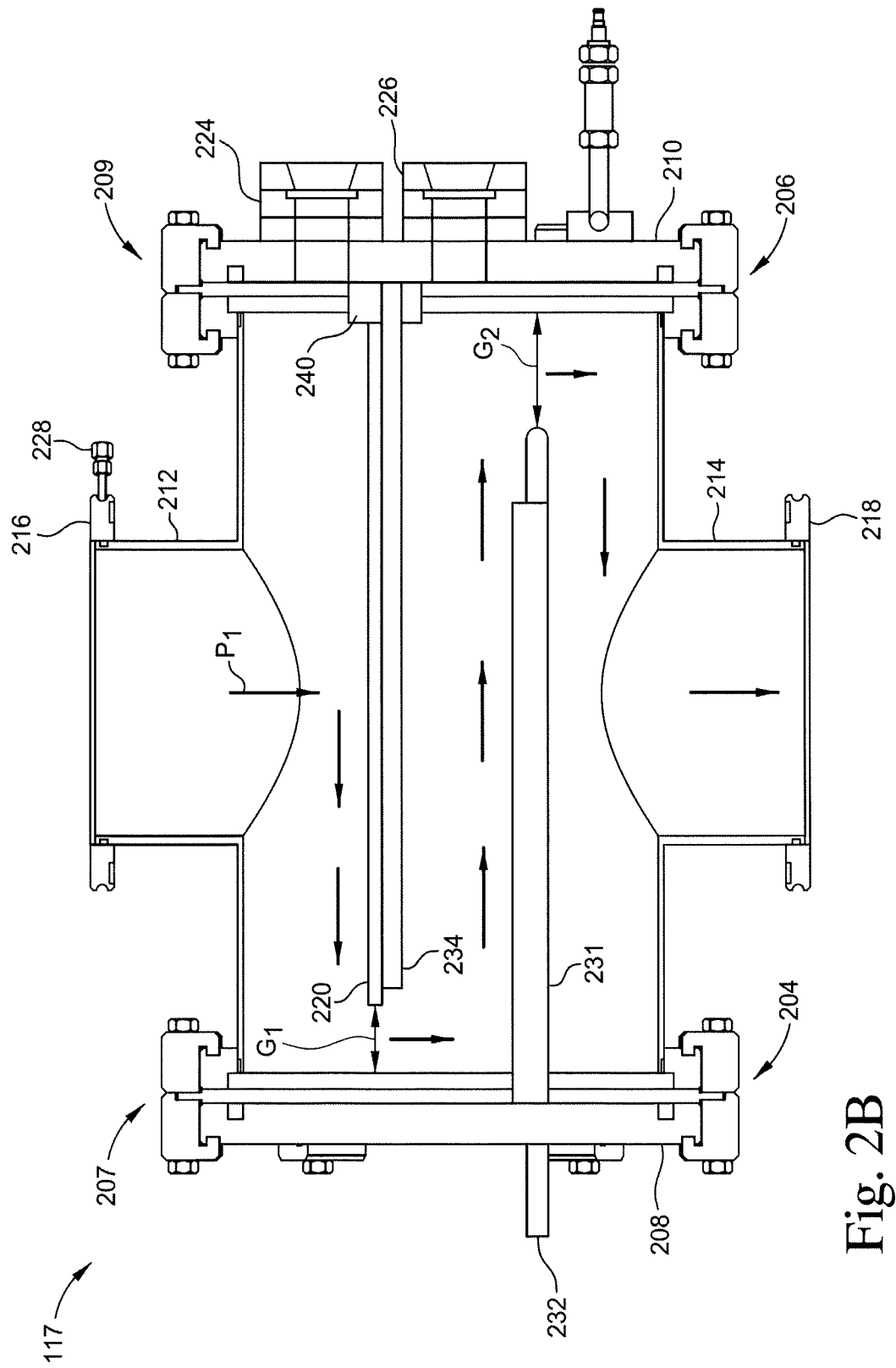
FIG. 2B is a schematic cross-sectional view of the exhaust cooling apparatus of FIG. 2A according to one embodiment described herein.

FIG. 2B is a schematic cross-sectional view of the exhaust cooling apparatus 117 of FIG. 2A according to one embodiment described herein. As shown in FIG. 2B, the exhaust cooling apparatus 117 includes the plate 220 and a cooling plate 231 located downstream of the plate 220. The cooling plate 231 may be coupled to the first plate 208. The cooling plate 231 may include a cooling channel formed therein, a coolant inlet 232, and a coolant outlet (not shown) for flowing a coolant therethrough. Unlike the plate 220, the cooling plate 231 is actively cooled by the coolant flowing through the cooling channel. The cooling plate 231 is fabricated from stainless steel, aluminum, nickel coated aluminum, or any suitable material. The cooling plate 231 cools the exhaust prior to flowing out of the exhaust cooling apparatus 117, which protects downstream components, such as pumps, from being damaged. The cooling plate 231 also provides a cooled surface to provide condensable effluent a location to condense and get collected. The condensed material is reacted to form a gas during subsequent clean process, such as using cleaning radicals. Thus, the condensable effluent would not condense in the pump downstream or on other surfaces with lower temperature. During operation, the plate 220 and the cooling plate 231 are maintained at different temperatures. In one embodiment, the cooling plate 231 is maintained at a temperature of about 20 degrees Celsius or less. The cooling plate 231 has a temperature that is substantially less than a temperature of the plate 220, and the difference between the temperature of the plate 220 and the temperature of the cooling plate 231 ranges from about 100 degrees Celsius to 500 degrees Celsius.

The plate 220 is coupled to the second plate 210, for example via a plurality of bolts 234 or other suitable technique. An optional thermal insulator 240 may be disposed between the second plate 210 and the plate 220 to thermally insulate the plate 220 from the cooled second plate 210. The thermal insulator 240 may be any suitable insulator, such as a ceramic standoff or tube slid over the bolts 234. In one embodiment, the thermal insulator 240 is a ceramic washer. The plate 220 and the cooling plate 231 may be fabricated from the same material. The plate 220 and the cooling plate 231 may each have a length that is less than a length of the body assembly 202 of the exhaust cooling apparatus 117. The length of the body assembly 202 is defined as a length between the first plate 208 and the second plate 210. Because the plate 220 and the cooling plate 231 are coupled to opposite plates 210, 208, and the length of the plate 220 and the cooling plate 231 is less than the length of the body assembly 202, the exhaust entering the exhaust cooling apparatus 117 may flow along a serpentine path $P_1$ defined around the plate 220 and the cooling plate 231. The plate 220 and the cooling plate 231 are offset lengthwise, as shown in FIG. 2B.

Described differently, the plate 220 may be coupled at a first end to the second plate 210 in a cantilevered manner, while the second end of the plate 220 may be spaced from first plate 208. Similarly, the cooling plate 231 may be coupled at a first end to the first plate 208 in a cantilevered manner, while a second end of the cooling plate 231 may be spaced from the second plate 210. As the opposite ends of the plates 220, 231 are spaced from opposite plates 208, 210, the exhaust entering the exhaust cooling apparatus 117 may flow along a serpentine path $P_1$ defined around the plate 220 and the cooling plate 231. The serpentine path $P_1$ increases the residual time of the exhaust gases passing through the exhaust cooling apparatus 117, thereby increasing the efficiency of particle removal from the exhaust stream. Furthermore, the serpentine path $P_1$ ensures that no particles can fall directly through the outlet port 214 and into the pump. The gaps $G_1$, $G_2$ between opposite ends of the plates 220, 231 and the opposite plates 208, 210 minimize the pressure drop from the inlet port 212 to the outlet port 214. Without the gaps $G_1$, $G_2$, the material deposited on the plate 220 and the cooling plate 231 can quickly block off the gas path and create ever increasing pressure drop across the inlet port 212 to the outlet port 214 until the vacuum pumping becomes inefficient to meet process chamber requirements.

Figure 2C:
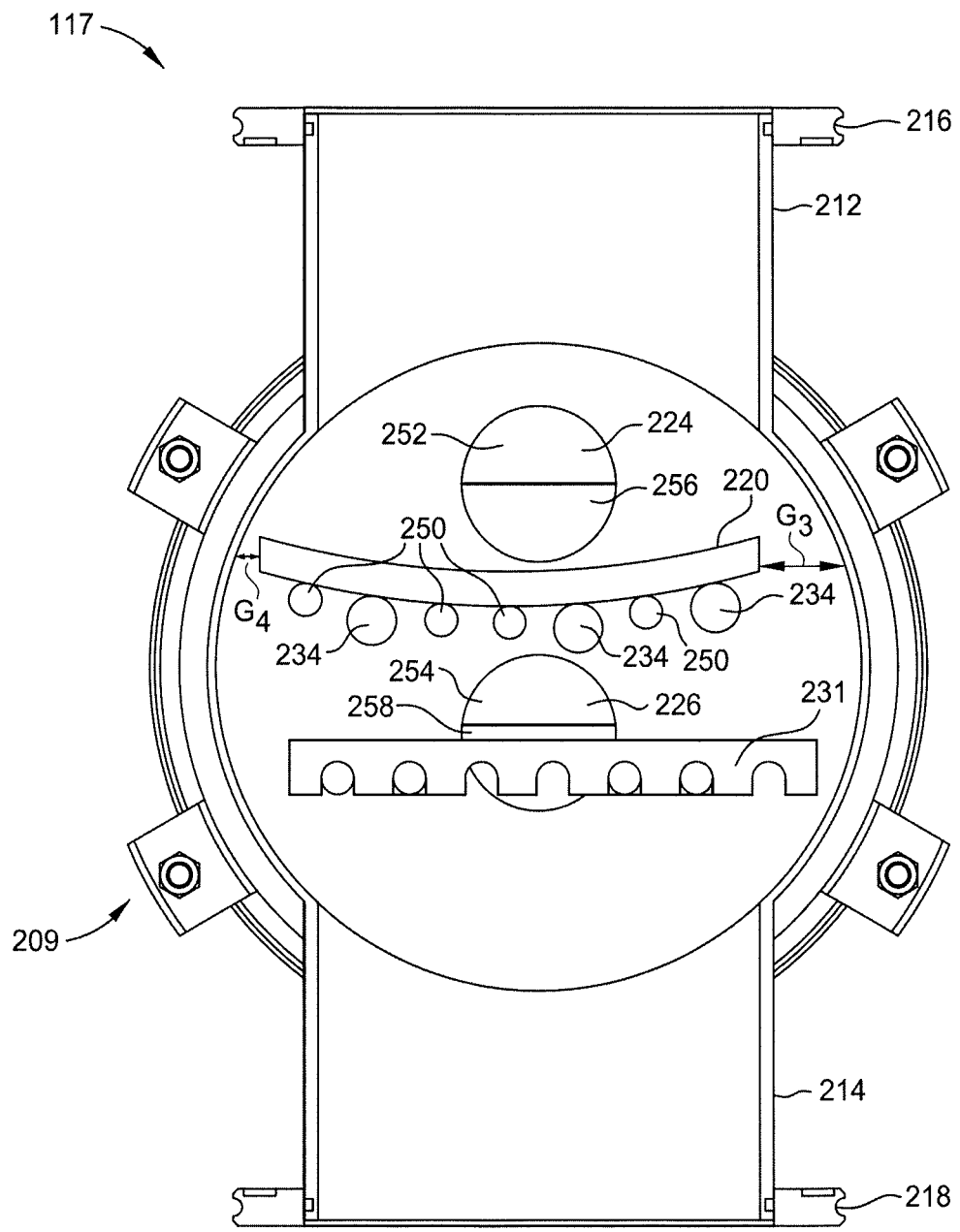
FIG. 2C is a schematic cross-sectional view of the exhaust cooling apparatus of FIG. 2A according to one embodiment described herein.

FIG. 2C is a schematic cross-sectional view of the exhaust cooling apparatus 117 of FIG. 2A according to one embodiment described herein. As shown in FIG. 2C, the exhaust cooling apparatus 117 includes the cylindrical body assembly 202, the plate 220, and the cooling plate 231. The plate 220 has a width that is less than a chord of the body assembly 202 of the exhaust cooling apparatus 117 that passes through the plate 220. In other words, gaps $G_3$, $G_4$ are formed between opposite lateral sides of the plate 220 and the body assembly 202. Similarly, the cooling plate 231 has a width that is less than a chord of the body assembly 202 of the exhaust cooling apparatus 117 that passes through the cooling plate 231. The plate 220 and the cooling plate 231 are laterally offset (widthwise), as shown in FIG. 2C. The plate 220 and the cooling plate 231 are offset both lengthwise and widthwise, so the exhaust flows through gaps formed between sides of the plate 220 and the body assembly 202 and between sides of the cooling plate 231 and the body assembly 202 in order to avoid pressure buildup in the exhaust cooling apparatus 117 and to increase the residual time of exhaust within the exhaust cooling apparatus 117, thereby increasing the cleaning efficiency.

The plate 220 may be further supported by a plurality of stiffeners 250, such as tubes, bars, beams, angles or other elongated profile. The bolts 234, the plate 220 and the plurality of stiffeners 250 may be fabricated from the same material to reduce warpage or separating due to mis-matches in the coefficient of thermal expansions. The plate 220 may be curved, as shown in FIG. 2C. The curvature of the plate 220 may be concave or convex. The curvature of the plate 220 improves the stiffness of the plate 220 and prevents further bending of the plate 220 when the plate 220 is exposed to elevated temperature, such as over 150 degrees Celsius, for example 400 degrees Celsius to 500 degrees Celsius. The curvature may be formed widthwise, as shown in FIG. 2C. In some embodiments, the curvature may be formed lengthwise. In one embodiment, the plate 220 is concave widthwise, which improves the collection of materials flowing into the exhaust cooling apparatus.

The viewing port 224 includes a window 252 and a shutter 256. The window 252 may be fabricated from sapphire and may include a coating that blocks UV radiation. The shutter 256 may be automatically or manually actuated to shield or expose the window 252 from the interior of the exhaust cooling apparatus 117. The shutter 256 is half open for illustration, as shown in FIG. 2C. During operation, the shutter 256 is either open (i.e., exposing the window 252 to the interior of the exhaust cooling apparatus 117) or closed (i.e., shielding the window 252 from the interior of the exhaust cooling apparatus 117). When the shutter 256 is open, an operator can view the plate 220 to determine whether cleaning radicals should be flowed into the exhaust cooling apparatus 117 to remove materials deposited on the plate 220. Similarly, the viewing port 226 includes a window 254 and a shutter 258. The window 254 may be fabricated from the same material as the window 252. The shutter 258 may be automatically or manually actuated to shield or expose the window 254. The shutter 258 is half open for illustration, as shown in FIG. 2C. During operation, the shutter 258 is either open (i.e., exposing the window 254 to the interior of the exhaust cooling apparatus 117) or closed (i.e., shielding the window 254 from the interior of the exhaust cooling apparatus 117). When the shutter 258 is open, an operator can view the cooling plate 231 to determine whether cleaning radicals should be flowed into the exhaust cooling apparatus 117 to remove materials deposited on the cooling plate 231. The operator can also tune the cleaning recipe (increasing or decreasing cleaning radical flow rates, plasma power, or purge flow rates) to optimize the automatic clean cycle cleaning performance based on the condition of the plate 220 or the cooling plate 231. The use of the shutters 256, 258 advantageously extends the life of the windows 252, 254.

Figure 3A:
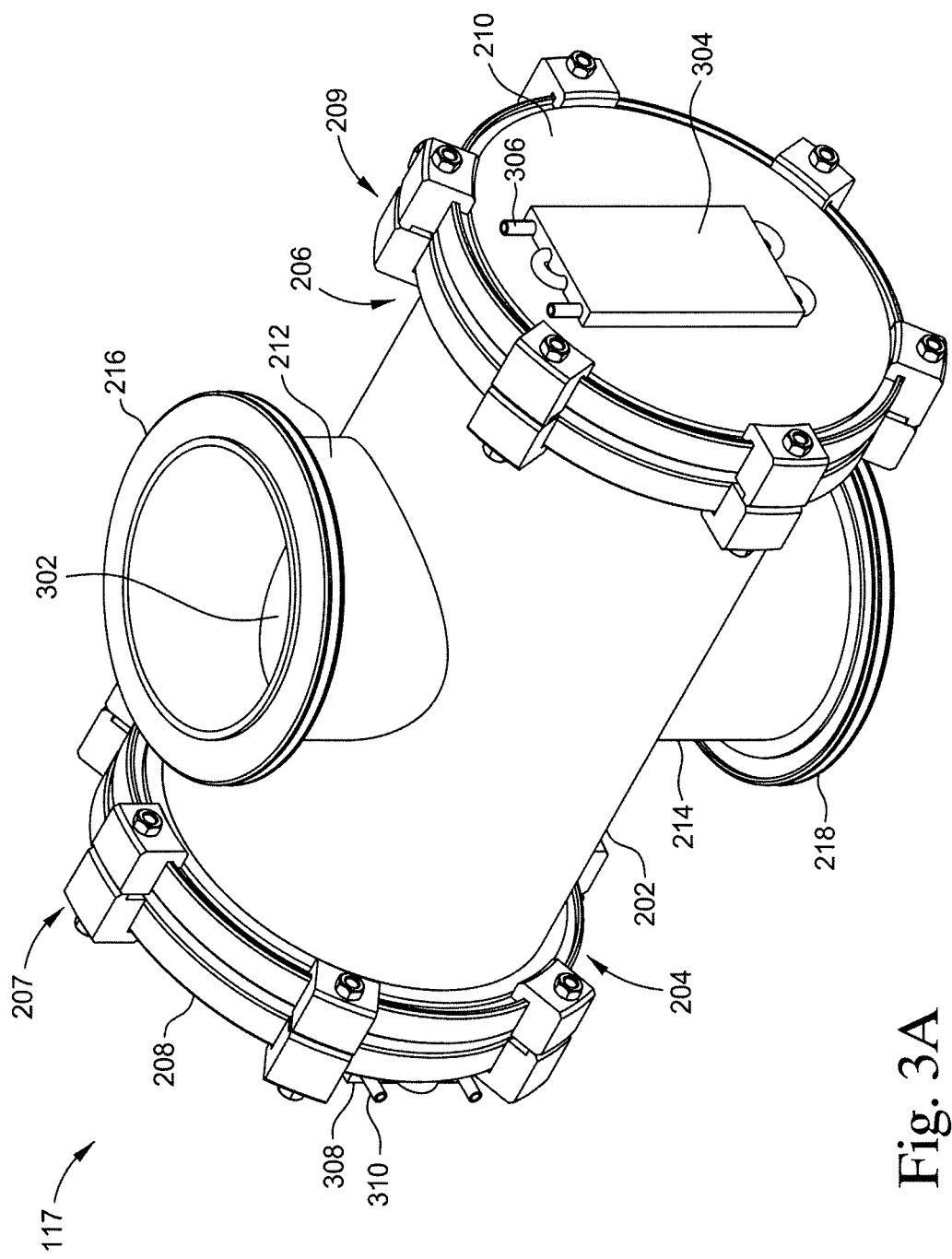
FIG. 3A is a schematic perspective view of the exhaust cooling apparatus according to one embodiment described herein.

FIG. 3A is a schematic perspective view of the exhaust cooling apparatus 117 according to one embodiment described herein. As shown in FIG. 3A, the exhaust cooling apparatus 117 includes the body assembly 202 having the first end 204, the second end 206 opposite the first end 204, the inlet port 212, and the outlet port 214 opposite the inlet port 212. The body assembly 202 may be cylindrical, as shown in FIG. 3A, or have another suitable shape. The first plate 208 is coupled to the first end 204 by the plurality of fastening devices 207, and the second plate 210 is coupled to the second end 206 by the plurality of fastening devices 209. The first and second plates 208, 210 may be an integral part of the body assembly 202. In one embodiment, the exhaust cooling apparatus 117 does not include one or more viewing ports. A tray 302 is disposed in the body assembly 202 of the exhaust cooling apparatus 117. During operation, the tray 302 collects materials, such as silicon dioxide, exiting the plasma source 100 (as shown in FIG. 1). Cleaning radicals, such as fluorine radicals, are introduced into the exhaust cooling apparatus 117 and react with the materials collected in the tray 302 to form a gas, such as silicon tetrafluoride. The cleaning radicals may be generated in the second plasma source 102 (as shown in FIG. 1) or in the remote plasma source that is coupled to the vacuum processing chamber 190 (as shown in FIG. 1).

The reaction of the cleaning radicals and the materials collected on the tray 302 may have an increased reaction rate at an elevated temperature, such as the temperature of the exhaust entering the exhaust cooling apparatus 117. Thus, the tray 302 is not cooled. For example, the tray 302 does not include a cooling channel formed therein for a coolant to flow therethrough. In other words, the temperature of the tray 302 is not controlled by a temperature controlling device. The tray 302 substantially takes the temperature of the exhaust entering the exhaust cooling apparatus 117. Alternatively, the tray 302 may be actively heated, for example by resistive heaters. The tray 302 is fabricated from a material having high thermal conductivity. The tray 302 may be fabricated from aluminum or stainless steel, such as 316L stainless steel.

The reaction of the cleaning radicals and the materials collected on the tray 302 may be exothermic. Heat transfer between the tray 302 and second plate 210 may be inhibited utilizing the techniques described above with reference to the heat transfer between the plate 220 and second plate 210.

A cooling device 308 is coupled to the first plate 208 to prevent the seal disposed between the first plate 208 and the first end 204 from degrading due to the elevated temperature of the first plate 208. The cooling device 308 includes a tube 310 connected to a coolant source, and a coolant is flowed through the tube 310 to lower the temperature of the first plate 208. Similarly, a cooling device 304 may be coupled to the second plate 210 to prevent the seal disposed between the second plate 210 and the second end 206 from degrading due to the elevated temperature of the second plate 210. The cooling device 304 may include a tube 306 connected to a coolant source, and a coolant is flowed through the tube 306 to lower the temperature of the second plate 210. A thermal insulator (not shown) may be disposed between the second plate 210 and the tray 302 to reduce the heat transfer between the tray 302 and the cooled second plate 210. Similarly, cooling devices 216, 218 may be coupled to the inlet port 212 and the outlet port 214, respectively.

Figure 3B:
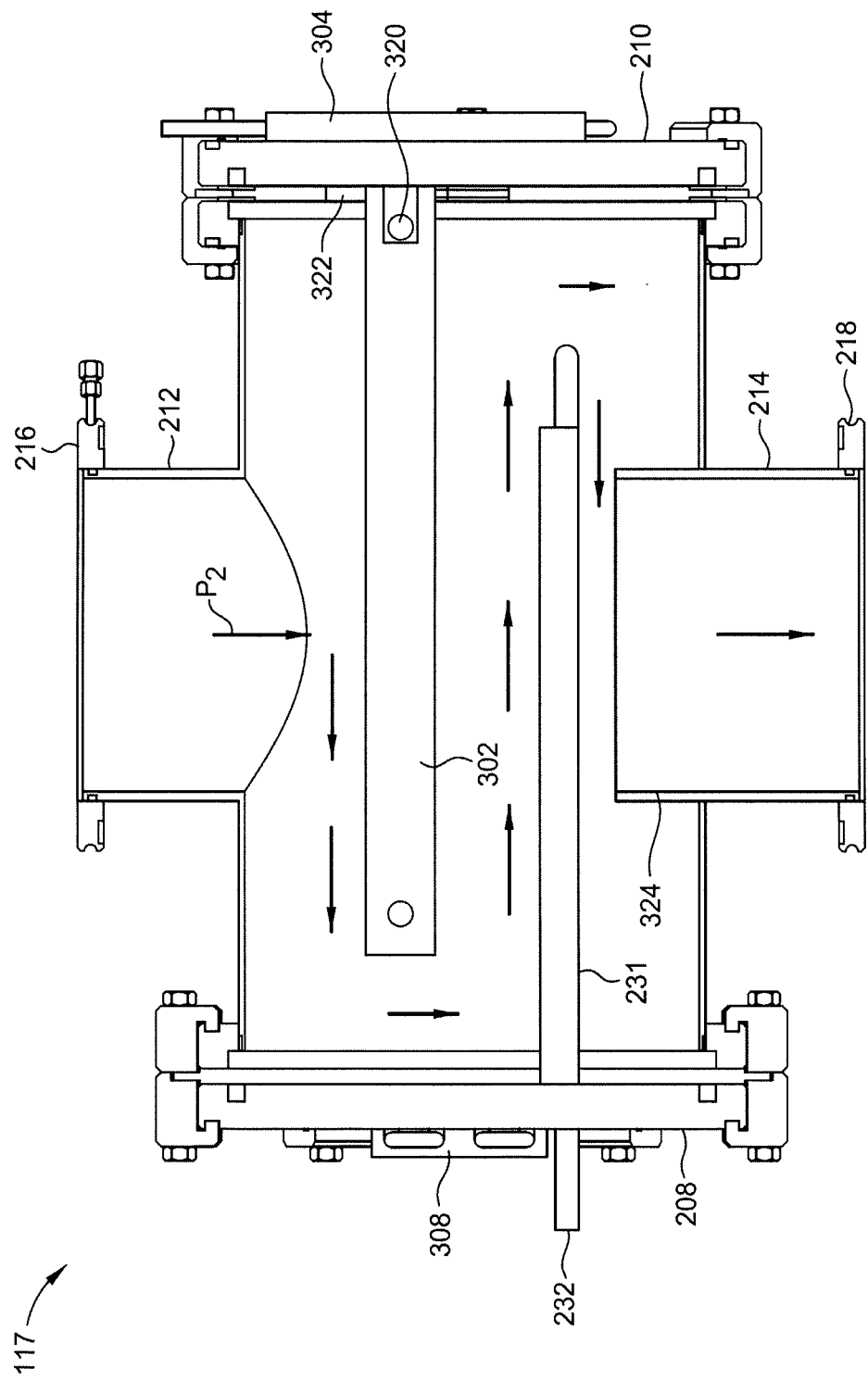
FIG. 3B is a schematic cross-sectional view of the exhaust cooling apparatus of FIG. 3A according to one embodiment described herein.

FIG. 3B is a schematic cross-sectional view of the exhaust cooling apparatus 117 of FIG. 3A according to one embodiment described herein. As shown in FIG. 3B, the exhaust cooling apparatus 117 includes the tray 302 and the cooling plate 231 located downstream of the tray 302. The tray 302 may be coupled to the second plate 210 via one or more fasteners 320. An optional thermal insulator 322 may be disposed between the second plate 210 and the tray 302 to thermally insulate the tray 302 from the cooled second plate 210. The thermal insulator 322 may be any suitable insulator. In one embodiment, the thermal insulator 322 is a ceramic washer. The tray 302 and the cooling plate 231 may be fabricated from the same material. The tray 302 and the cooling plate 231 may each have a length that is less than a length of the body assembly 202 of the exhaust cooling apparatus 117. Because the tray 302 and the cooling plate 231 are coupled to opposite plates 210, 208, and the length of the tray 302 and the cooling plate 231 is less than the length of the body assembly 202, the exhaust entering the exhaust cooling apparatus 117 may flow along a serpentine path $P_2$ defined around the tray 302 and the cooling plate 231. The tray 302 and the cooling plate 231 are offset lengthwise, as shown in FIG. 3B.

Described differently, the tray 302 may be coupled at a first end to the second plate 210 in a cantilevered manner, while a second end of the tray 302 may be spaced from first plate 208. Similarly, the cooling plate 231 may be coupled at a first end to the first plate 208 in a cantilevered manner, while a second end of the cooling plate 231 may be spaced from the second plate 210. As the opposite ends of the tray 302 and plate 231 are spaced from opposite plates 208, 210, the exhaust entering the exhaust cooling apparatus 117 may flow along a serpentine $P_2$ path defined around the tray 302 and the cooling plate 231. As noted above, the serpentine path P₂ increases the residual time of the exhaust gases passing through the exhaust cooling apparatus 117, thereby increasing the efficiency of particle removal from the exhaust stream.

A liner 324 is coupled to an inside surface of the outlet port 214. The liner 324 may be cylindrical, as shown in FIG. 3B. The liner 324 is utilized as an additional measure to prevent any particles from falling through the outlet port 214 into the pump. The gas will flow up and over the lip of the liner 324, but particles of sufficient mass will be prevented from exiting the exhaust cooling apparatus 117 through the outlet port 214.

Figure 3C:
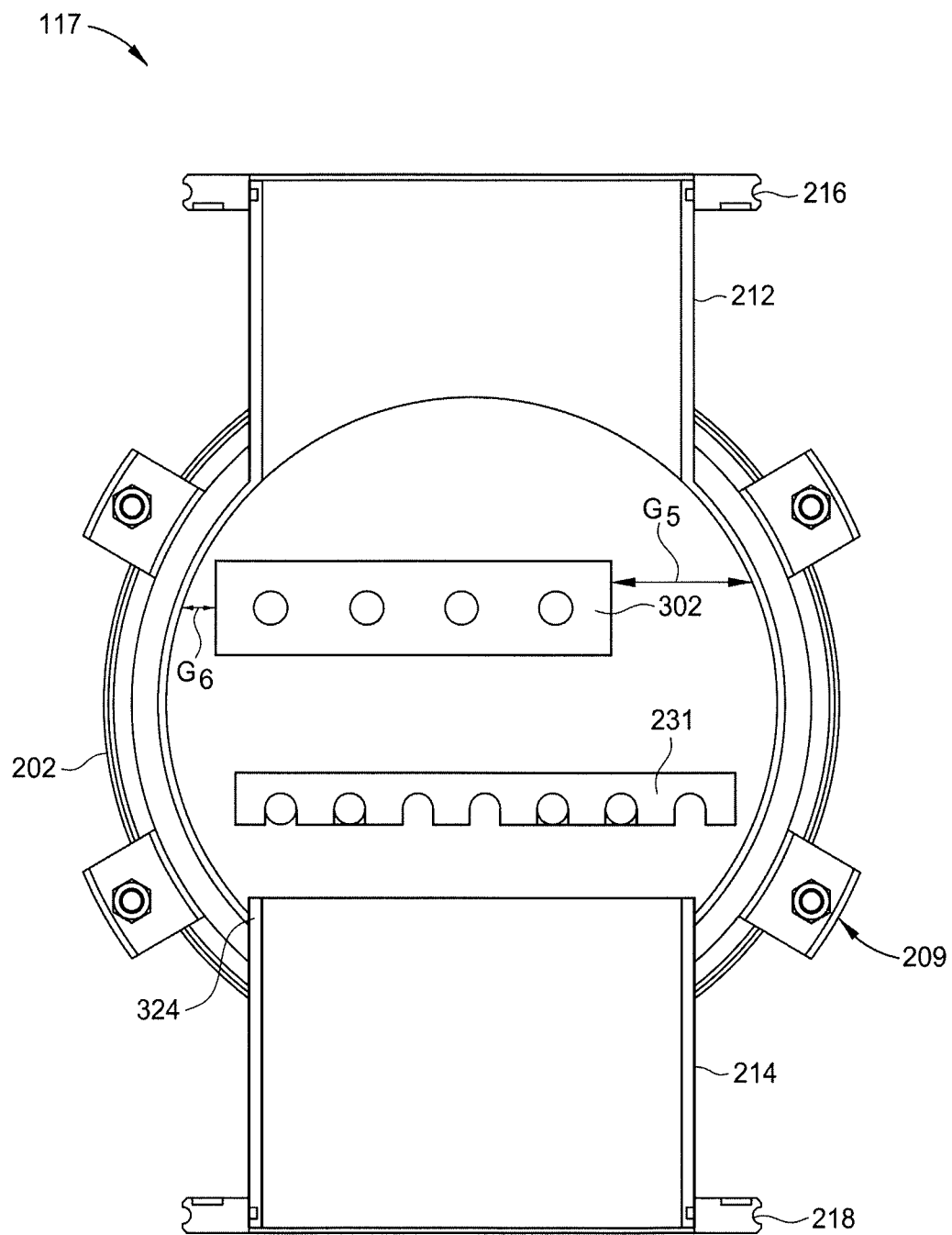
FIG. 3C is a schematic cross-sectional view of the exhaust cooling apparatus of FIG. 3A according to one embodiment described herein.

FIG. 3C is a schematic cross-sectional view of the exhaust cooling apparatus 117 of FIG. 3A according to one embodiment described herein. As shown in FIG. 3C, the exhaust cooling apparatus 117 includes the cylindrical body assembly 202, the tray 302, and the cooling plate 231. The tray 302 has a width that is less than a chord of the body assembly 202 of the exhaust cooling apparatus 117 that passes through the tray 302. In other words, gaps $G_5$, $G_6$ are formed between opposite lateral sides of the tray 302 and the body assembly 202. Similarly, the cooling plate 231 has a width that is less than a chord of the body assembly 202 of the exhaust cooling apparatus 117 that passes through the cooling plate 231. The tray 302 and the cooling plate 231 are laterally offset (widthwise), as shown in FIG. 3C. The tray 302 and the cooling plate 231 are offset both lengthwise and widthwise, so the exhaust flows through gaps formed between sides of the tray 302 and the body assembly 202 and between sides of the cooling plate 231 and the body assembly 202 in order to avoid pressure buildup in the exhaust cooling apparatus 117, thereby increasing the cleaning efficiency.

By including a plate, such as the plate 220, or a tray, such as the tray 302, in the exhaust cooling apparatus, reaction rate of the reaction between the materials deposited on the plate or in the tray and cleaning radicals due to the elevated temperature of the plate or the tray is improved. Furthermore, the plate or tray prevents solid materials from flowing through the exhaust cooling apparatus and into the pumps. The solid materials deposited on the plate or collected in the tray are reacted with cleaning radicals to form a gas, which does not cause any damage to downstream components.

While the foregoing is directed to embodiments of the present disclosure, other and further embodiments of the disclosure may be devised without departing from the basic scope thereof, and the scope thereof is determined by the claims that follow.

What is claimed is:

1. An exhaust cooling apparatus comprising:
   a body assembly comprising:
      a first end;
      a second end formed opposite the first end;
      an inlet port; and
      an outlet port formed at the second end, the body assembly having a hollow interior fluidly connecting the inlet port and the outlet port;
   a first end plate coupled to the first end;
   a second end plate coupled to second end;
   a first plate cantilevered from the first end plate and disposed in the hollow interior; and
   a second plate cantilevered from the second end plate and disposed in the hollow interior between the first plate and the outlet port, the second plate having a coolant channel formed therein coupled to a coolant inlet and configured to maintain the second plate cooler than the first plate.

2. The exhaust cooling apparatus of claim 1, the second end plate opposite the first end plate enclosing the hollow interior and disposed on the body assembly between the first end and the second end.

3. The exhaust cooling apparatus of claim 1 further comprising:
   a first serpentine flow path defined around the first and second plates in a first direction between the inlet port and the outlet port.

4. The exhaust cooling apparatus of claim 3 further comprising:
   a second serpentine flow path defined around the first and second plates in a second direction between inlet port and outlet port, the first direction orientated 90 degrees relative to the second direction.

5. The exhaust cooling apparatus of claim 1, wherein the first plate is a tray.

6. The exhaust cooling apparatus of claim 1, wherein the first plate is curved.

7. An abatement system comprising:
   a first plasma source having an exhaust exit;
   an exhaust cooling apparatus having a body, the body having an inlet port, an outlet port to an interior with a cooling plate disposed in the interior, the first plasma source coupled to the inlet port, wherein an exhaust gas is configured to flow out of the exhaust exit of the first plasma source and into the inlet; and
   a second plasma source coupled via a conduit to the exhaust cooling apparatus.

8. The abatement system of claim 7, wherein the exhaust cooling apparatus comprises:
   a body assembly having a first end, a second end, an inlet port and an outlet port, the body assembly having a hollow interior fluidly connecting the inlet port and the outlet port;
   a first plate disposed in the hollow interior; and
   a second plate disposed in the hollow interior between the first plate and the outlet port, the second plate having temperature control elements operable to maintain the second plate cooler than the first plate.

9. The abatement system of claim 8, wherein the first plate is cantilevered from the first end.

10. The abatement system of claim 9, wherein the second plate is cantilevered from the second end.

11. The abatement system of claim 8, wherein the exhaust cooling apparatus comprises:
   a first serpentine flow path defined around the first and second plates in a first direction between the inlet port and the outlet port.

12. The abatement system of claim 11, wherein the exhaust cooling apparatus comprises:
   a second serpentine flow path defined around the first and second plates in a second direction between the inlet port and the outlet port, the first direction orientated 90 degrees relative to the second direction.

13. The abatement system of claim 8, wherein the first plate is a tray.

14. The abatement system of claim 8, wherein the first plate is curved.

15. An exhaust cooling apparatus comprising:
   a body assembly having a first end, a second end, an inlet port and an outlet port, the body assembly having a hollow interior fluidly connecting the inlet port and the outlet port;
   a tray disposed in the hollow interior wherein the tray is cantilevered from the first end; and a plate disposed in the hollow interior between the tray and the outlet port, the plate having a coolant channel formed therein coupled to a coolant inlet.

16. The exhaust cooling apparatus of claim 15, wherein the plate is cantilevered from the second end.

17. The exhaust cooling apparatus of claim 15 further comprising:
a first serpentine flow path defined around the tray and the plate in a first direction between the inlet port and the outlet port.

18. The exhaust cooling apparatus of claim 17 further comprising:
a second serpentine flow path defined around the tray and the plate in a second direction between the inlet port and the outlet port, the first direction orientated 90 degrees relative to the second direction.

19. The exhaust cooling apparatus of claim 2, wherein the body assembly has a body length from the first end plate to the second end plate, and the first end plate and the second end plate have corresponding lengths that are less than the body length, and wherein the first plate and second plate form a first serpentine flow path between the inlet port and the outlet port for exhaust.

20. The exhaust cooling apparatus of claim 1, wherein the first plate is coupled to the first end plate by a plurality of fastening devices.

21. The exhaust cooling apparatus of claim 20, wherein during operation for abatement, the first plate and the second plate are configured to have a temperature difference from about 100 degrees Celsius to about 500 degrees Celsius.

22. The exhaust cooling apparatus of claim 1, wherein a thermal insulator is disposed between the first plate and the first end plate.

* * * * *